United States Patent
Kim et al.

(10) Patent No.: US 9,633,589 B2
(45) Date of Patent: Apr. 25, 2017

(54) DISPLAY DEVICE HAVING ESD CIRCUIT

(71) Applicant: SAMSUNG DISPLAY CO., LTD., Yongin, Gyeonggi-Do (KR)

(72) Inventors: Sujin Kim, Ulsan (KR); Young-Il Ban, Hwaseong-si (KR); Sun-Koo Kang, Seoul (KR); Sunkyu Son, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 9 days.

(21) Appl. No.: 14/608,657

(22) Filed: Jan. 29, 2015

(65) Prior Publication Data
US 2016/0019826 A1 Jan. 21, 2016

(30) Foreign Application Priority Data

Jul. 21, 2014 (KR) .................. 10-2014-0091977

(51) Int. Cl.
| | |
|---|---|
| *G09G 5/00* | (2006.01) |
| *G09G 3/20* | (2006.01) |
| G09G 3/36 | (2006.01) |
| H01L 27/02 | (2006.01) |

(52) U.S. Cl.
CPC ............. *G09G 3/20* (2013.01); *G09G 3/3685* (2013.01); *G09G 2300/0426* (2013.01); *G09G 2300/08* (2013.01); *G09G 2330/025* (2013.01); *G09G 2330/04* (2013.01); *H01L 27/0266* (2013.01)

(58) Field of Classification Search
CPC ..... G09G 3/3685; G09G 3/20; H01L 27/0266
USPC .......................................... 345/212
See application file for complete search history.

(56) References Cited

U.S. PATENT DOCUMENTS

| | | | | |
|---|---|---|---|---|
| 2003/0016478 | A1* | 1/2003 | Liu | H01L 27/0266 361/56 |
| 2007/0002189 | A1* | 1/2007 | Komatsu | G09G 3/20 348/776 |
| 2007/0046615 | A1* | 3/2007 | Tsuida | G09G 3/3614 345/100 |
| 2007/0069237 | A1* | 3/2007 | Lin | H01L 27/0255 257/173 |
| 2007/0187762 | A1* | 8/2007 | Saiki | G09G 3/3677 257/355 |

(Continued)

FOREIGN PATENT DOCUMENTS

| | | |
|---|---|---|
| KR | 10-0218505 B1 | 6/1999 |
| KR | 10-2005-0097033 A | 10/2005 |

(Continued)

*Primary Examiner* — Adam J Snyder
(74) *Attorney, Agent, or Firm* — Lee & Morse P.C.

(57) ABSTRACT

A display device includes a first interconnection line, a first data driver, a second interconnection line, an electrostatic discharge (ESD) circuit, and a display panel. The first connection line transmits a data driving signal. The first data driver includes the first interconnection line and output a data signal based on the data driving signal. The second interconnection line passes through the first data driver and transmits a gate driving signal. The ESD) circuit in the first data driver and discharges static electricity transmitted through the second interconnection line. The first gate driver outputs a gate signal based on the gate driving signal transmitted through the second interconnection line. The display panel receives the data signal and the gate signal.

18 Claims, 7 Drawing Sheets

(56) References Cited

U.S. PATENT DOCUMENTS

| | | | |
|---|---|---|---|
| 2008/0042950 A1* | 2/2008 | Park | G09G 3/3677 345/87 |
| 2008/0117558 A1* | 5/2008 | Shih | H01L 27/0248 361/117 |
| 2009/0108738 A1* | 4/2009 | Kwak | G09G 3/3208 313/504 |
| 2009/0140370 A1* | 6/2009 | Jou | H01L 23/585 257/487 |
| 2010/0123245 A1* | 5/2010 | Lee | H01L 27/0251 257/737 |
| 2010/0238094 A1* | 9/2010 | Cho | G09G 3/3208 345/82 |
| 2011/0018129 A1* | 1/2011 | Suzuki | H01L 27/0292 257/737 |
| 2011/0122537 A1* | 5/2011 | Lin | H02H 9/046 361/56 |
| 2011/0128485 A1* | 6/2011 | Kim | G02F 1/1345 349/122 |
| 2013/0062607 A1* | 3/2013 | Yamazaki | H01L 27/0266 257/59 |
| 2013/0069919 A1* | 3/2013 | Ryu | G09G 3/3611 345/204 |

FOREIGN PATENT DOCUMENTS

| | | |
|---|---|---|
| KR | 10-2006-0000939 A | 1/2006 |
| KR | 10-2013-0143335 A | 12/2013 |

\* cited by examiner

DISPLAY DEVICE HAVING ESD CIRCUIT

CROSS-REFERENCE TO RELATED APPLICATION

Korean Patent Application No. 10-2014-0091977, filed on Jul. 21, 2014, is hereby incorporated by reference in its entirety.

BACKGROUND

1. Field

One or more embodiments described herein relate to a display device.

2. Description of the Related Art

A variety of displays have been developed. Examples include liquid crystal displays, organic light-emitting diode displays, electrowetting displays, plasma displays, and electrophoresis displays. These display device typically include a display panel, a gate driver to provide gate signals to pixels in the panel, and a data driver to provide data signals to the pixels. The data signals are transmitted in response to the gate signals, and may be used to control gradation of the pixels or display a desired image on the display device.

In operation, gate control signals are transmitted to the gate driver via an interconnection structure. The gate driver generates gate signals in response to the gate control signals. When static electricity produced, for example, by rubbing, is applied to the gate driver via the interconnection structure, the gate driver may malfunction and/or be damaged.

SUMMARY

In accordance with one embodiment, a display device includes a first interconnection line to transmit a data driving signal; a first data driver, including the first interconnection line, to output a data signal based on the data driving signal; a second interconnection line passing through the first data driver, the second interconnection line to transmit a gate driving signal; an electrostatic discharge (ESD) circuit in the first data driver, the ESD circuit to discharge static electricity transmitted through the second interconnection line; a first gate driver to output a gate signal based on the gate driving signal transmitted through the second interconnection line; and a display panel to receive the data signal and the gate signal. The second interconnection line may be connected to an input terminal of the ESD circuit. The ESD circuit may include one or more switches. The switches may include diodes.

The ESD circuit may include a first diode electrically connected between the input terminal of the ESD circuit and a third interconnection line applied with a logic voltage; and a second diode electrically connected between the input terminal of the ESD circuit and a fourth interconnection line applied with a ground voltage. The first diode may include a cathode terminal connected to the third interconnection line and an anode terminal connected to the input terminal of the ESD circuit, and the second diode may include an anode terminal connected to the fourth interconnection line and a cathode terminal connected to the input terminal of the ESD circuit.

When negative static electricity is transmitted to the ESD circuit through the second interconnection line, the negative static electricity may be discharged to the fourth interconnection line through the second diode. The ESD circuit may include a power clamp connected in parallel to the first and second diodes between the third and fourth interconnection lines.

When positive static electricity is transmitted to the ESD circuit through the second interconnection line, the positive static electricity may be discharged to the fourth interconnection line through the first diode, the third interconnection line, and the power clamp. The first data driver may include a first terminal to receive an input signal and a second terminal to output an output signal, and the second interconnection line may include a first interconnection to connect an external terminal to the first terminal, a second interconnection to connect the first terminal to the second terminal, and a third interconnection to connect the second terminal to the first gate driver.

The second interconnection of the second interconnection line may be electrically connected to an input terminal of the ESD circuit. The device may include a plurality of second data drivers, wherein the second interconnection line does not physically pass through the plurality of second data drivers. The first data driver may be adjacent to an outermost one of the plurality of second data drivers.

The device may include a second gate driver in the display panel and spaced apart from the first gate driver. The may include a plurality of the first data drivers corresponding to the first and second gate drivers, respectively. The plurality of first data drivers may be respectively disposed at positions corresponding to the first and second gate drivers. The first gate driver may be integrated on the display panel. The gate driving signal may include a vertical trigger signal, a first clock signal, and a second clock signal.

In accordance with another embodiment, an apparatus includes a first interconnection to transmit a first signal; a first circuit including the first interconnection line, the first circuit to output a second signal based on the first signal; a second interconnection passing through the first circuit, the second interconnection to transmit a third signal; an electrostatic discharge (ESD) circuit in the first circuit, the ESD circuit to discharge static electricity transmitted through the second interconnection; and a second circuit to output a fourth signal based on the third signal transmitted through the second interconnection. The first signal may include a data driving signal, the second signal may include a data signal, the third signal may include a gate driving signal, the fourth signal may include a gate signal, and the gate signal and the driving signal may be output to a display.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
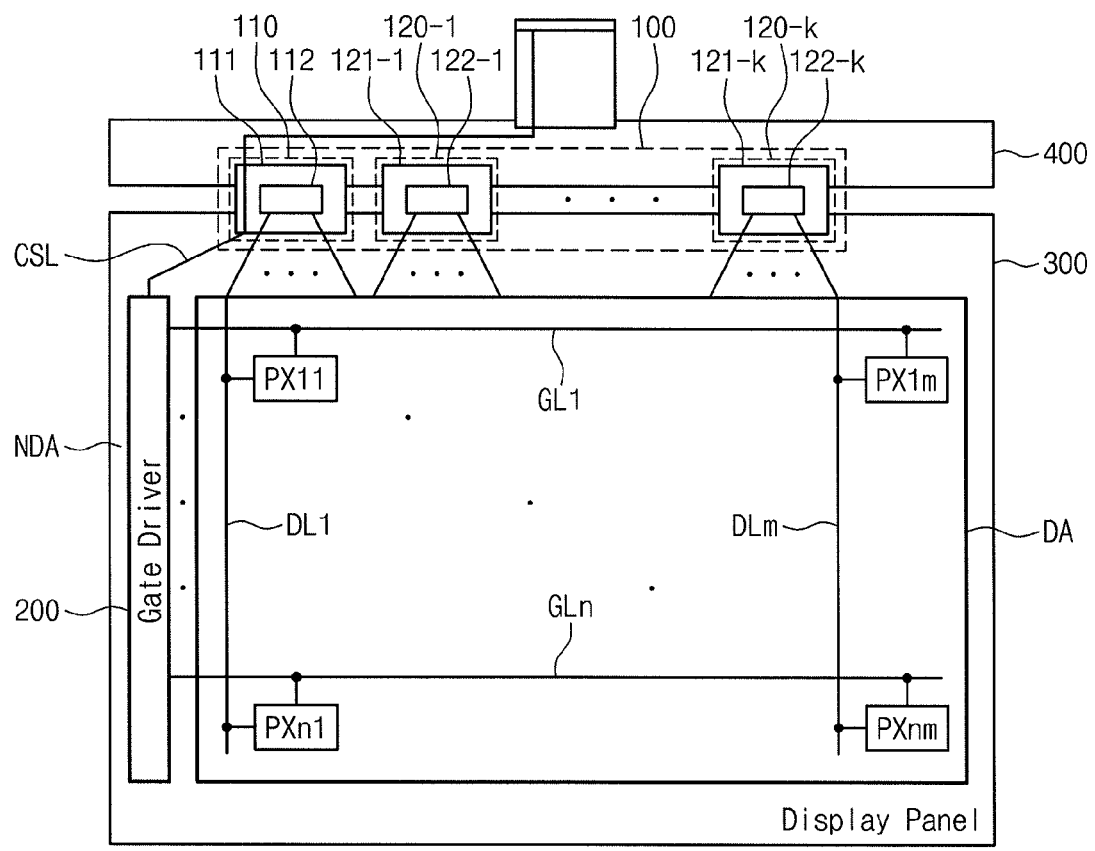
FIG. 1 illustrates an embodiment of a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

FIG. 1 illustrates an embodiment of a display device which includes a display panel 300, a data driver 100, a gate driver 200, and a driving circuit substrate 400. The data driver 100 may be provided between the display panel 300 and the driving circuit substrate 400. The gate driver 200 may be provided in the display panel 300.

For example, the display panel 300 may include a display region DA including a plurality of pixels PX11-PXnm arranged in a matrix, and a non-display region NDA around the display region DA. The display panel 300 may include a gate driving line CSL to transmit a gate driving signal, and the gate driver 200 which is configured to produce a gate signal in response to the gate driving signal transmitted through the gate driving line CSL. The display panel 300 may further include a plurality of gate lines GL1-GLn to transmit gate signals, and a plurality of data lines DL1-DLm which cross the gate lines GL1-GLn.

The gate driving line CSL may transmit a gate driving signal from a timing controller (e.g., mounted on the driving circuit substrate 400) to the gate driver 200. The gate driving signal may be one or more control signals, which may be transmitted from the timing controller and may be used for producing the gate signals in the gate driver 200. In the present embodiment, the gate driving line CSL may include lines for transmitting the control signals from the timing controller to the gate driver 200. The gate driving line CSL may transmit the gate driving signal. Alternatively, the gate driving line CSL may connect the timing controller to the gate driver 200.

In one embodiment, the gate driving line CSL may be connected to the gate driver 200 via a first data driver 110. For example, the gate driving line CSL may pass through the first data driver 110 and be connected to the gate driver 200. The first data driver 110 will be described in more detail with reference to the data driver 100.

The gate driver 200 produces the gate signals in response to the gate driving signals from the gate driving line CSL. The gate driver 200 may provide the gate signals to the pixels through the gate lines GL1-GLn in a sequential manner and in the unit of a row. Accordingly, the pixels PX11-PXnm may be operated, in the unit of a row, in response to the gate signals.

The gate driver 200 may be disposed at one side of the non-display region NDA. The gate driver 200 may be disposed in such a way that it is embedded in or integrated on the non-display region NDA. For example, the gate driver 200 may be an amorphous silicon TFT gate (ASG) driver circuit on the non-display region NDA. In another embodiment, the gate driver 200 may be disposed at respective sides of the non-display region NDA, as will be described in more detail with reference to FIG. 2.

The data driver 100 is between the display panel 300 and the driving circuit substrate 400. The data driver 100 produces data signals in response to data driving signals from the timing controller. The data driving signals may be some of the control signals, which may be transmitted from the timing controller to the data driver 100 and which may be used for producing the data signals.

Figure 3:
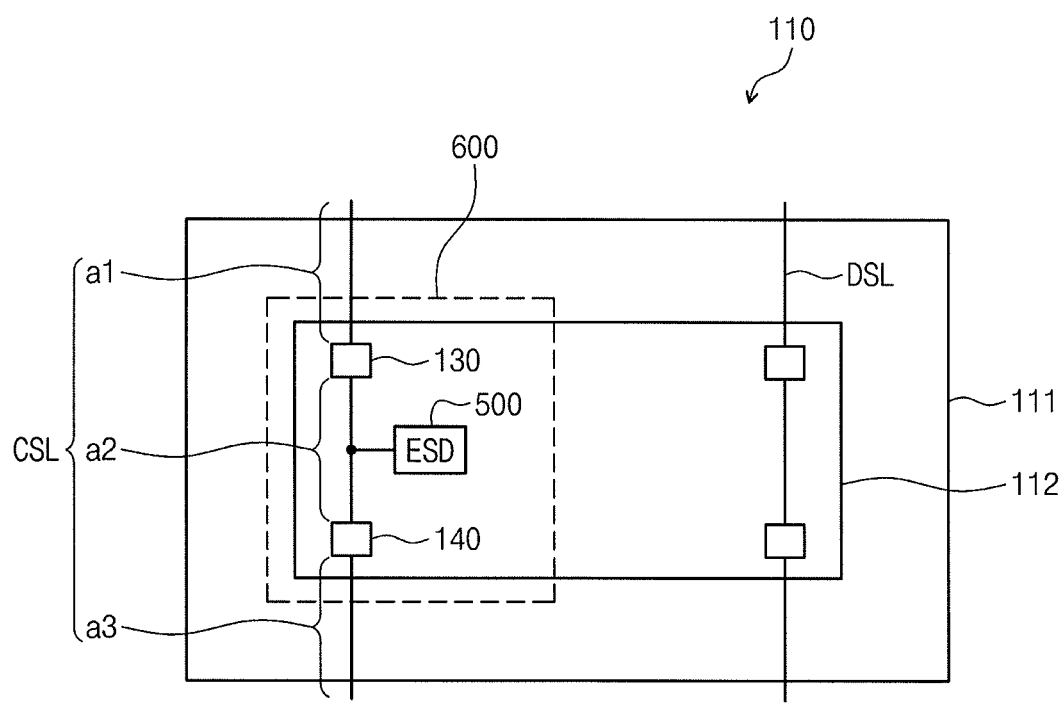
FIG. 3 illustrates an embodiment of a data driver.

The data driver 100 and the timing controller may be electrically connected to each other via data driving lines DSL (e.g., refer to FIG. 3). Accordingly, the data driver 100 may receive the data driving signals from the timing controller through the data driving line DSL, and may produce the data signals in response to the received data driving signals. The data driver 100 may provide the produced data signals to the pixels PX11-PXnm through the data lines DL1-DLm.

The data driver 100 may include the first data driver 110 physically connected to the gate driving line CSL and a plurality of second data drivers 120-1-120-$k$ which are physically separated from the gate driving line CSL. Accordingly, the gate driving line CSL may physically pass through the first data driver 110, and may not physically pass through the second data drivers 120-1-120-$k$.

Because the gate driving line CSL is connected to the first data driver 110, the first data driver 110 may include a dummy region allowing for connection with the gate driving line CSL, as will be described in more detail with reference to FIGS. 3 through 5. For illustrative purposes only, the data driving line DSL will be called "the first interconnection line" and the gate driving line CSL will be called "the second interconnection line."

The first data driver 110 may include a first source driving chip 112 and a first flexible circuit board 111. The first source driving chip 112 may be mounted on the first flexible circuit board 111. The second data drivers 120-1-120-$k$ may include a plurality of second source driving chips 122-1-122-$k$ and a plurality of second flexible printed circuit boards 121-1-121-$k$. The second source driving chips 122-1-122-$k$ may be mounted on the second flexible printed circuit boards 121-1-121-$k$, respectively. In another embodiment, the first and second source driving chips 112 and 122-1-122-$k$ may be mounted, in a chip-on-glass (COG) manner, on a portion of the non-display region NDA, which is adjacent to a top portion of the display region DA. The first and second source driving chips 112 and 122-1-122-$k$ may be mounted in different ways in other embodiments.

The pixels PX11-PXnm may be formed at respective intersections of the gate lines GL1-GLn and the data lines DL1-DLm. For example, the pixels PX11-PXnm may be arranged to form an (m×n) matrix, e.g., m columns and n rows.

Each of the pixels PX11-PXnm may be connected to a corresponding one of the gate lines GL1-GLn and a corresponding one of the data lines DL1-DLm. Each of the pixels PX11-PXnm may receive the data signals transmitted through the corresponding one of the data lines DL1-DLm, in response to the gate signals transmitted through the corresponding one of the gate lines GL1-GLn. Accordingly, each of the pixels PX11-PXnm may display a gradation corresponding to the data signal transmitted thereto, thereby making it possible to display a desired image on the display device.

Figure 2:
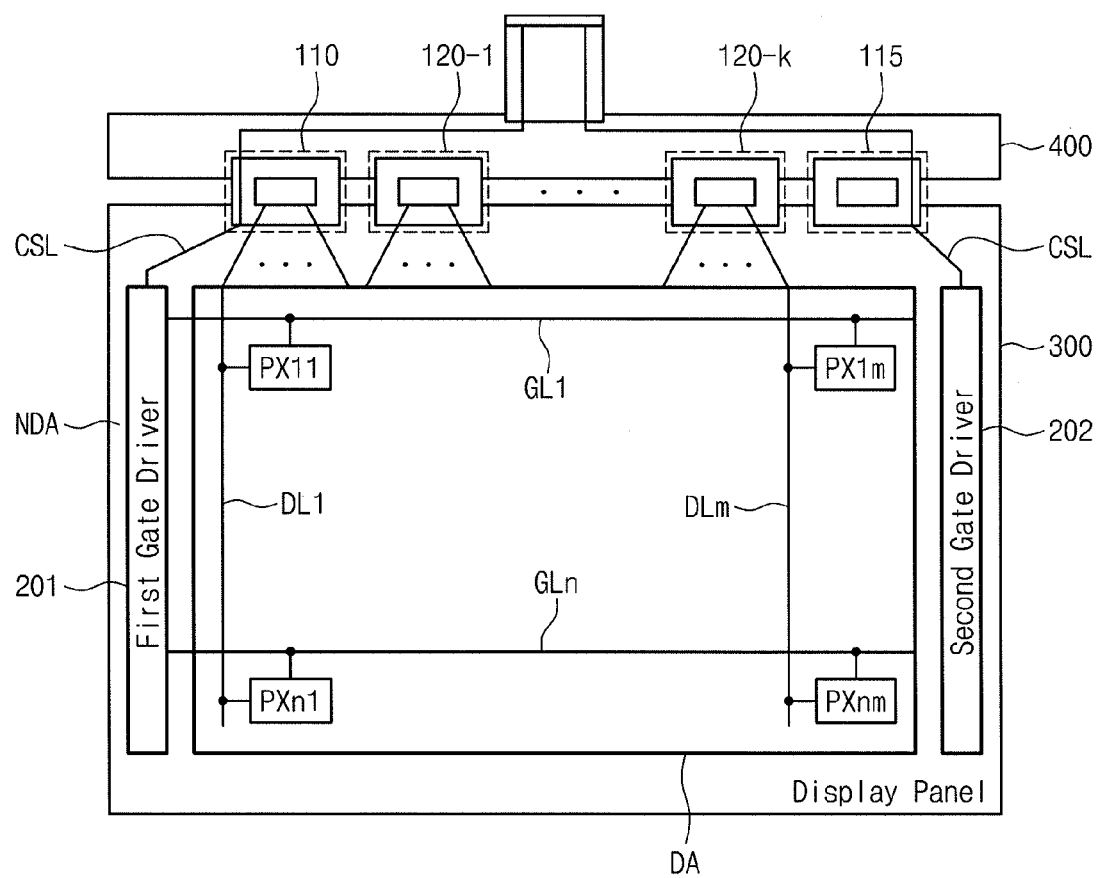
FIG. 2 illustrates another embodiment of a display device.

FIG. 2 illustrates another embodiment of a display device. In the case of FIG. 1, only one gate driver 200 (namely, first gate driver 200) is in the display device. In other words, the first gate driver 200 may be disposed at one side of the non-display region NDA. The first data driver 110 may be disposed more adjacently to the first gate driver 200 than the second data driver 120-1-120-k. For example, the first data driver 110 may be adjacent to the leftmost or rightmost ones (e.g., 120-1 or 120-k) of the second data drivers 120-1-120-k. When the first gate driver 200 is at a left side of the non-display region NDA, the first data driver 110 may be at a left side of the leftmost one (e.g., 120-1) of the second data drivers 120-1-120-k.

In FIG. 2, the display device may include a plurality of gate drivers 201 and 202. For example, the display device may include a first gate driver 201 and a second gate driver 202. The first and second gate drivers 201 and 202 may be at respective sides of the non-display region NDA.

The display device may include first data drivers 110 and 115 which respectively correspond to the first and second gate drivers 201 and 202. The first data drivers 110 and 115 may be adjacent to the leftmost or rightmost ones (e.g., 120-1 or 120-k) of the second data drivers 120-1-120-k. For example, when the first and second gate drivers 201 and 202 are at left and right sides, respectively, of the non-display region NDA, the first data drivers 110 and 115 may be adjacent to the leftmost and rightmost ones (e.g., 120-1 and 120-k), respectively, of the second data drivers 120-1-120-k.

FIG. 3 illustrates an embodiment of the first data driver in FIG. 1.

Referring to FIG. 3, each of the first and second data drivers 110 and 120-1 include at least one first interconnection line DSL. The first interconnection line DSL may transmit the data driving signals from the timing controller to the first or second data drivers 110 or 120-1. The first data driver 110 may further include at least one second interconnection line CSL.

For example, the first data driver 110 may include both of the first and second interconnection lines DSL and CSL, whereas the second data driver 120-1 may include the first interconnection line DSL but not the second interconnection line CSL. In other words, the first data driver 110 may be connected to both of the first and second interconnection lines DSL and CSL, whereas the second data driver 120-1 may be connected to the first interconnection line DSL and disconnected from the second interconnection line CSL.

In order to reduce complexity in the drawings, the first data driver 110 is illustrated to be connected to the first interconnection line DSL and the second interconnection line CSL. But, example embodiments of the inventive concepts may not be limited thereto. For example, the first data driver 110 may be connected to a plurality of first interconnection lines and a plurality of second interconnection lines.

The first data driver 110 may further include an electrostatic discharge (ESD) circuit 500. The ESD circuit 500 may include at least one switching device for discharging a large amount of current produced when an ESD event occurs. The ESD circuit 500 may be in the source driving chip 112 of the first data driver 110 to discharge electrostatic current transmitted through the second interconnection line CSL.

For example, the second interconnection line CSL may include first, second, and third interconnection parts a1, a2, and a3. The first interconnection part a1 may connect an external terminal to an input terminal 130 of the first data driver 110, the second interconnection part a2 may connect the input terminal 130 to an output terminal 140 of the first data driver 110, and the third interconnection part a3 may connect the output terminal 140 to the gate driver 200. The second interconnection part a2 may be a part of the source driving chip 112. The second interconnection part a2 may be electrically connected to the ESD circuit 500 in the source driving chip 112. Accordingly, it is possible to discharge electrostatic current transmitted through the second interconnection line CSL, through the ESD circuit 500, to thereby prevent the gate driver 200 from being damaged by the electrostatic current.

In one embodiment, the first data driver 110 may have a larger size than the gate driver 200. Accordingly, the first data driver 110 may provide more room for the ESD circuit 500, compared with the gate driver 200. In other words, a sufficient area for the ESD circuit 500 may be provided in the first data driver 110. However, in other embodiments, the ESD circuit 500 may be at other locations including the gate driver or another driver or control circuit.

When the ESD circuit 500 is in the first data driver 110, not the gate driver 200, it is possible to reduce the area occupied by the gate driver 200. As a result, the entire size of the display device may be reduced. In contrast, when the ESD circuit 500 is in the non-display region NDA mounted with the gate driver 200, the display device may have an increased bezel width. For this reason, if the ESD circuit 500 is provided in the first data driver 110, not in the non-display region NDA, it is possible to reduce a bezel width or overall size of the display device.

In one embodiment, the data driver 100 may include an ESD circuit, and the first data driver 110 may be connected to an input terminal of the ESD circuit of the data driver 100 through the second interconnection line CSL. In this case, even if the ESD circuit 500 is not added, it is possible to discharge electrostatic current transmitted through the second interconnection line CSL. For example, there is no necessity to add the ESD circuit 500 or a device for preventing an ESD-induced damage in the first data driver 110 of this embodiment. This makes it possible to prevent the display device from being damaged by an ESD event, without additional cost or modification.

The first data driver 110 may include a dummy region 600 which includes the ESD circuit 500 and the second interconnection line CSL. The dummy region 600 may be provided, for example, by adjusting a size of the first data driver 110, the number and positions of interconnection lines connected thereto, and/or the number and positions of input/output terminals, as described in more detail with reference to FIGS. 4 and 5.

Figure 4:
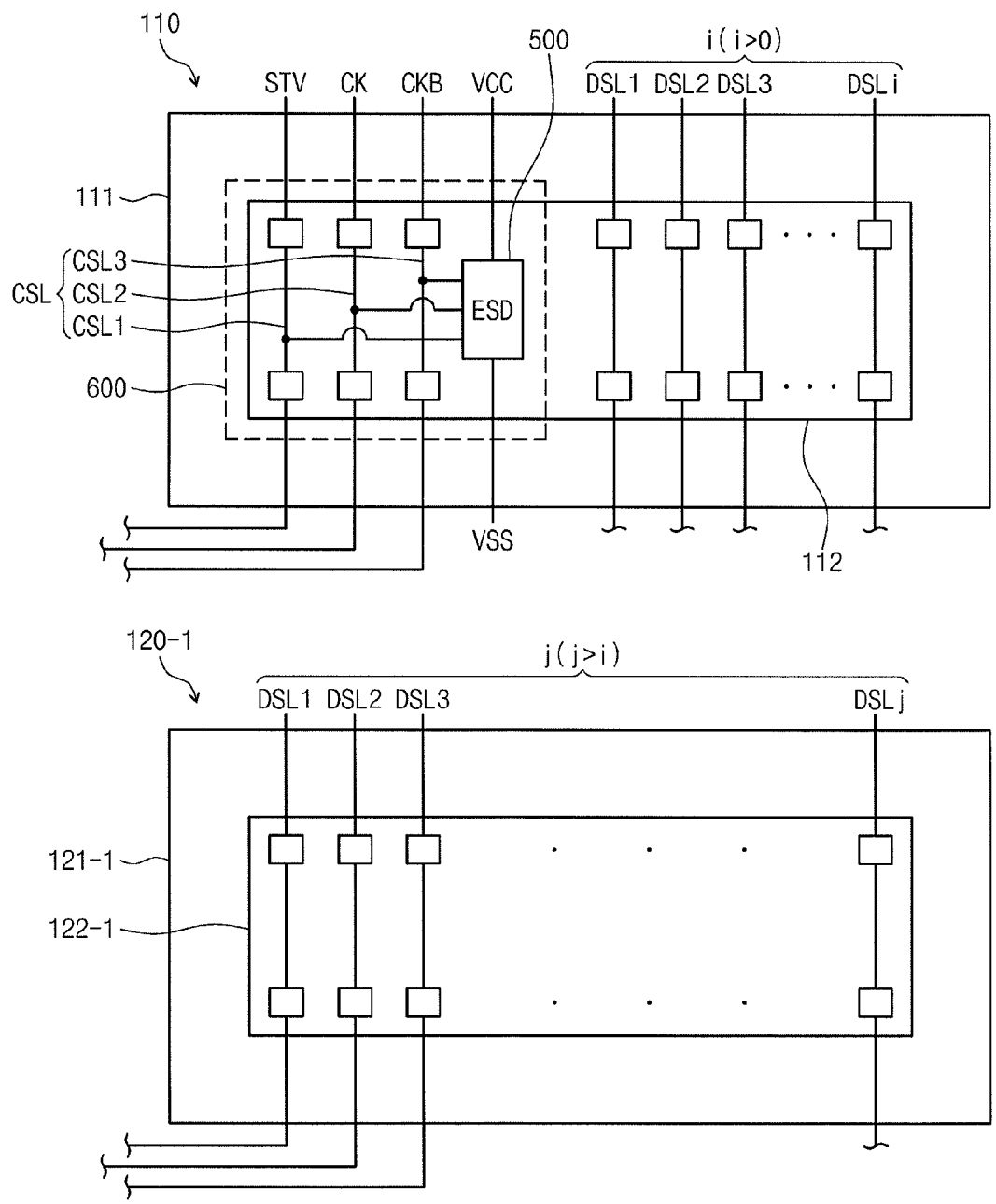
FIGS. 4 and 5 illustrate examples of first and second data drivers.
Figure 5:
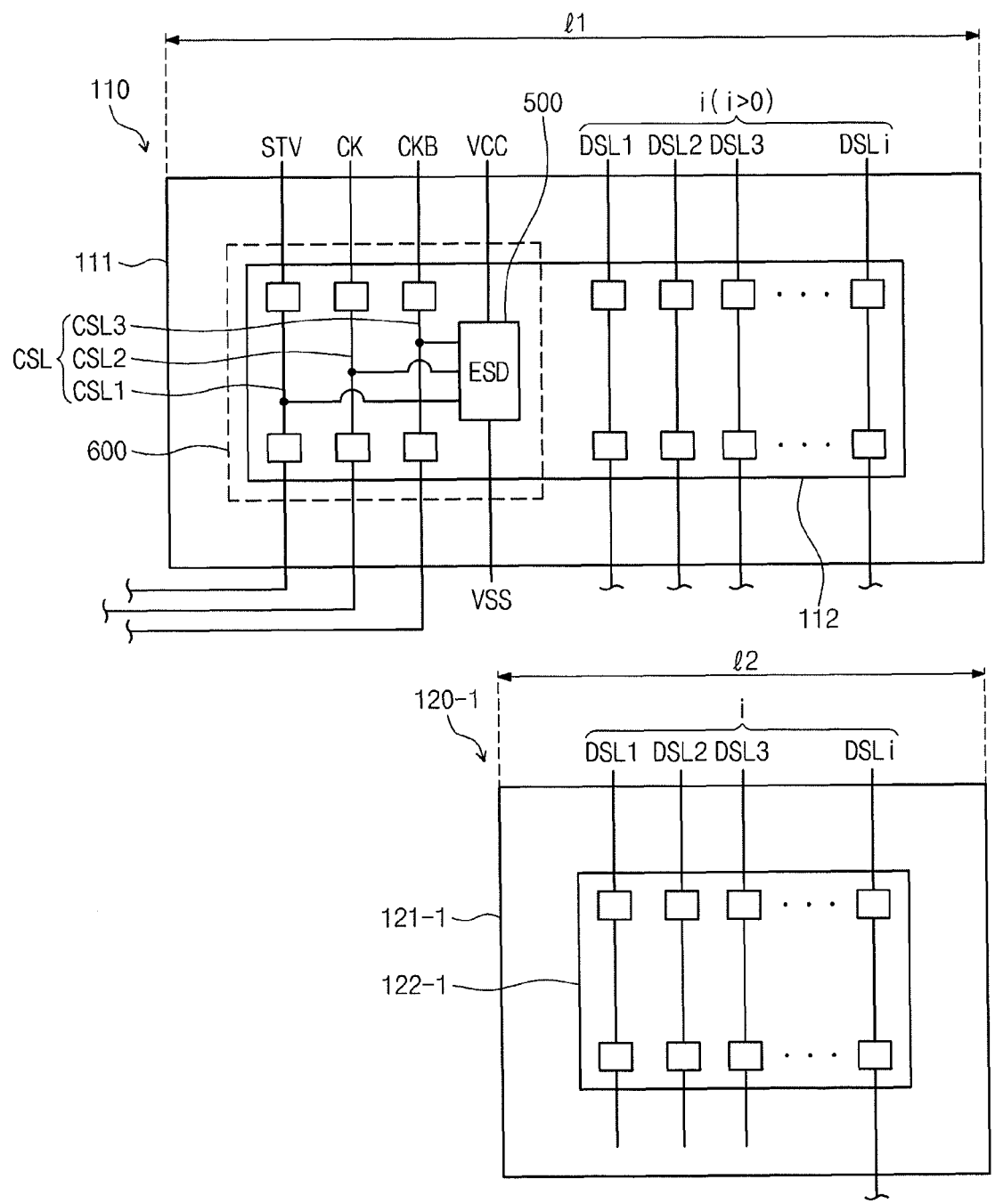

FIGS. 4 and 5 illustrate examples of the first and second data drivers of FIG. 1. In FIGS. 4 and 5, the first data driver 110 may include the second interconnection line CSL and the ESD circuit 500. The dummy region 600 may be in the first data driver 110. The dummy region 600 may be a margin region of the first data driver 110 provided to accommodate the second interconnection line CSL and the ESD circuit 500. Accordingly, the first data driver 110 may have an internal structure different from the second data driver 120-1.

In the embodiment of FIG. 4, the first data driver 110 and the second data driver 120-1 may be different from each other in terms of the number and positions of first lines connected thereto. For example, when the first data driver 110 and the second data driver 120-1 have the same size, the number and positions of the first lines connected to the first data driver 110 may be different from those of the second data driver 120-1.

For example, the first lines DSL1-DSLi may be connected to the first data driver 110. The first lines DSL1-DSLi may be side-by-side in a region of the first data driver 110, as illustrated. In contrast, the first lines DSL1-DSLj may be connected to the second data driver 120-1. The number i may be smaller than the number j.

In the embodiment of FIG. 5, the size of the first data driver 110 may be different from the second data driver 120-1. For example, when the numbers of the first lines connected to the first and second data drivers 110 and 120-1 are the same, the size of the first data driver 110 may be larger than the second data driver 120-1.

For example, each of the first and second data drivers 110 and 120-1 may be connected to the same number of first lines DSL1-DSLi. In this case, the horizontal width 11 of the first data driver 110 may be longer than the horizontal width 12 of the second data driver 120-1. This may be because the dummy region 600 for the second interconnection line CSL and the ESD circuit 500 is in the first data driver 110. The first lines DSL1-DSLi may be arranged side-by-side in a region of the first data driver 110. The dummy region 600 may be in another region of the first data driver 110.

As described above, by adjusting the number or positions of the first lines DSL1-DSLi connected to the first data driver 110, it is possible to provide an area for the dummy region 600 in the first data driver 110. At least one second interconnection line CSL and the ESD circuit 600 may be in the dummy region 600 by the above adjustment.

Referring again to FIGS. 4 and 5, the second interconnection line CSL may be in the first data driver 110 to transmit at least one gate driving signal from the timing controller. The gate driving signal may include, for example, one or more of a vertical trigger signal STV, a first clock signal CK, and a second clock signal CKB. In this case, the second interconnection line CSL may include a vertical trigger signal line CSL1, a first clock signal line CSL2, and a second clock signal line CSL3 for respectively transmitting the vertical trigger signal STV, the first clock signal CK, and the second clock signal CKB. In other embodiments, different numbers and/or types of the gate driving signals may be used.

Figure 6:
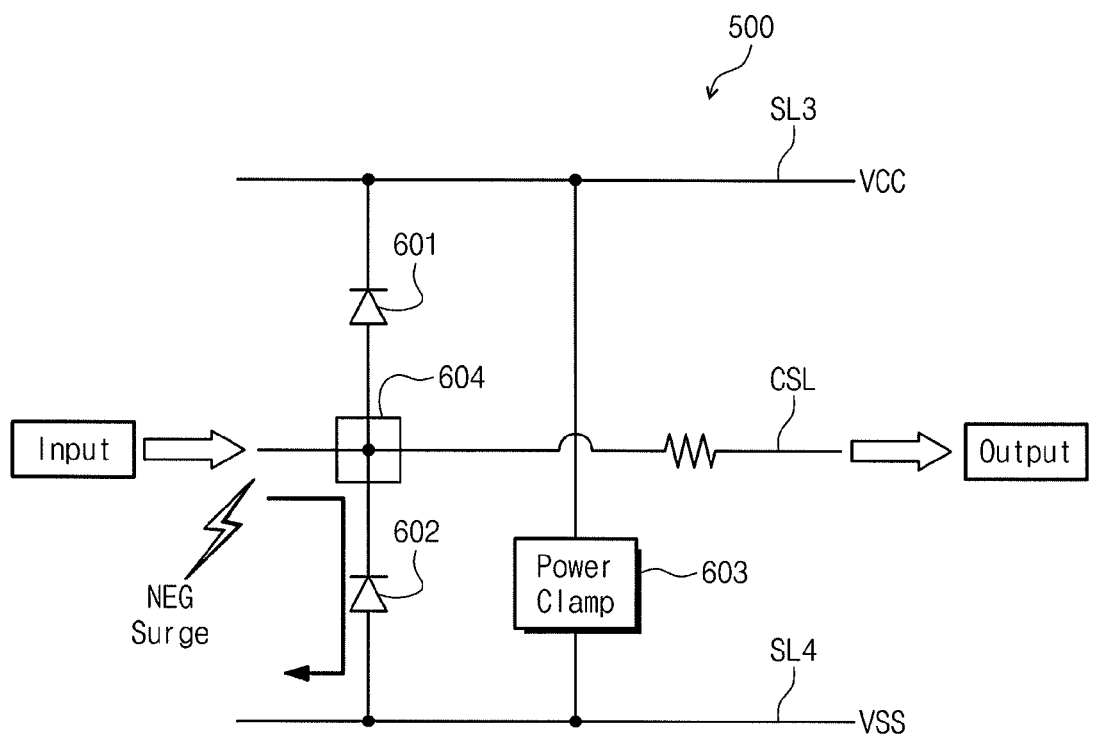
FIGS. 6 and 7 illustrate examples of a electrostatic discharge circuit.
Figure 7:
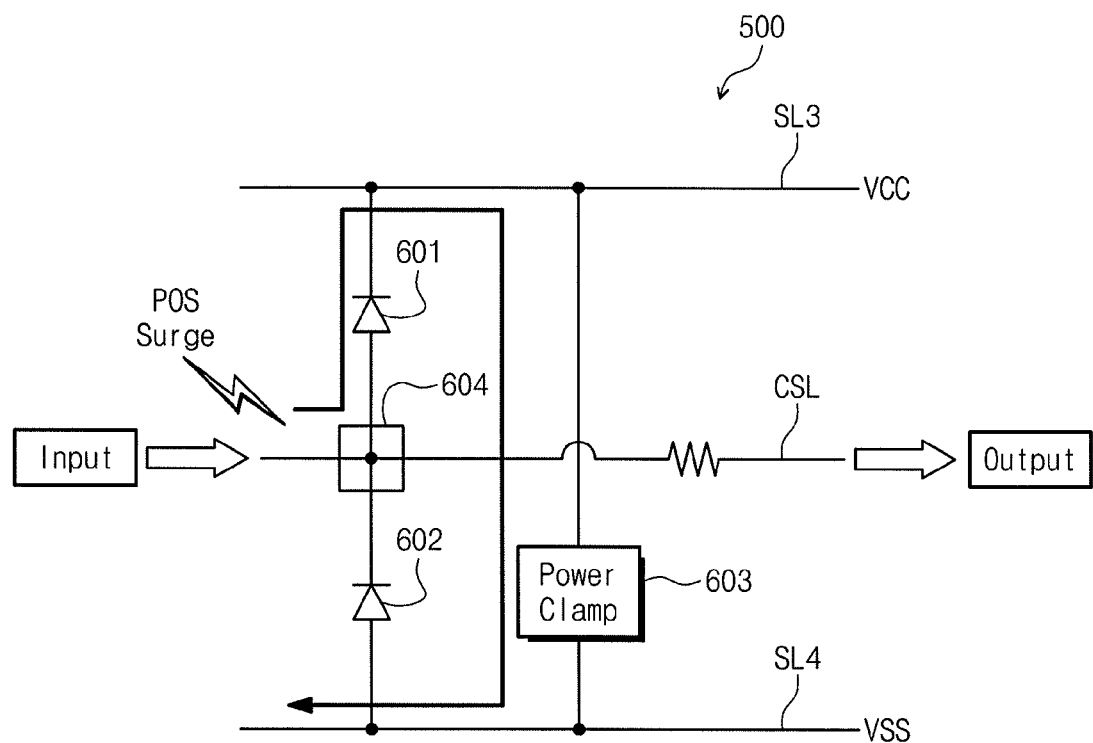

FIGS. 6 and 7 illustrate examples of an ESD circuit of FIG. 3, which, for example, may correspond to the ESD circuit 500. In FIGS. 6 and 7, operations of the ESD circuit are illustrated when negative and positive electrostatic currents are respectively transmitted to the ESD circuit 500 through the second interconnection line CSL. For example, the second interconnection line CSL for transmitting the gate driving signal may be electrically connected to an input terminal 604 of the ESD circuit 500. Accordingly, electrostatic current transmitted through the second interconnection line CSL may flow into the ESD circuit through the input terminal 604 of the ESD circuit 500.

The ESD circuit 500 may include at least one switching device, which, for example, may be a diode, a transistor, or a thyristor. For the sake of simplicity, the description that follows will pertain to diodes used for the switching device of the ESD circuit 500.

In one embodiment, the ESD circuit 500 includes first and second diodes 601 and 602 connected in series to each other through the input terminal 604 of the ESD circuit 500. For example, the first diode 601 may have cathode and anode terminals connected to the third interconnection line SL3 (which may be applied with a logic voltage VCC) and the input terminal 604, respectively. The second diode 602 may have anode and cathode terminals connected to a fourth interconnection line SL4 (which may be applied with a ground voltage VSS) and the input terminal 604, respectively.

The ESD circuit 500 may further include a power clamp 603. In the ESD circuit 500, the power clamp 603 may discharge positive static electricity, as will be described in more detail with reference to FIG. 7.

Referring to FIG. 6, if negative static electricity is transmitted through the second interconnection line CSL, the second diode 602 of the ESD circuit 500 may be turned on. For example, in the case where the negative static electricity is transmitted to the cathode terminal of the second diode 602, the second diode 602 may be turned on. In this case, the negative static electricity may be discharged to the fourth interconnection line SL4, which is applied with the ground voltage VSS, through the second diode 602. Accordingly, it is possible to prevent the negative static electricity from being transmitted to the gate driver 200.

Referring to FIG. 7, if positive static electricity is transmitted through the second interconnection line CSL, the first diode 601 of the ESD circuit 500 may be turned on. For example, in the case where the positive static electricity is transmitted to the anode terminal of the first diode 601, the first diode 601 may be turned on. In this case, the positive static electricity may be discharged to the third interconnection line SL3 through the turned-on first diode 601 to turn on the power clamp 603 connected to the third interconnection line SL3. As a result, the positive static electricity may be discharged to the fourth interconnection line SL4 applied with the ground voltage VSS through the turned-on power clamp 603.

The power cramp 603 may be connected in parallel to the first diodes 601 and second diodes 602 between the third interconnection line SL3 and fourth interconnection line SL4. Because the positive static electricity transmitted through the second interconnection line CSL is discharged to the fourth interconnection line SL4 of the ground voltage VSS through the first diode 601, the third interconnection line SL3, and the power clamp 603, it is possible to prevent the positive static electricity from flowing into the gate driver 200.

In accordance with one or more of the aforementioned embodiments, a data driver includes an ESD circuit to prevent static electricity from being transmitted to a gate driver. Thus, it is possible to prevent the gate driver from malfunctioning or being damaged by static electricity.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display device, comprising:
a first interconnection line to transmit a data driving signal, the first interconnection line including first group interconnection lines and second group interconnection lines, the data driving signal including first group data driving signals and second group data driving signals;
a first data driver chip including first data terminals to receive the first group data driving signals, the first data driver chip to output first group data signals based on the first group data driving signals;

a second interconnection line passing through the first data driver chip, the second interconnection line to transmit a gate driving signal;

an electrostatic discharge (ESD) circuit in the first data driver chip, the ESD circuit to discharge static electricity transmitted through the second interconnection line;

a first gate driver to output a gate signal based on the gate driving signal transmitted through the second interconnection line;

a second data driver chip, through which the second interconnection line does not physically pass, including second data terminals to receive the second group data driving signals and to output second group data signals based on the second group data driving signals; and a display panel to receive the data signal and the gate signal, wherein:

when the first data driver chip and the second data driver chip have a same size, gaps between the first data terminals of the first data driver chip are different from those of the second data terminals of the second data driver chip, and when the first data driver chip and the second data driver chip have different sizes, the gaps between the first data terminals of the first data driver chip are same as those of the second data terminals of the second data driver chip.

2. The device as claimed in claim 1, wherein the second interconnection line is connected to an input terminal of the ESD circuit.

3. The device as claimed in claim 2, wherein the ESD circuit includes one or more switches.

4. The device as claimed in claim 3, wherein the switches include diodes.

5. The device as claimed in claim 4, wherein the ESD circuit includes:

a first diode electrically connected between the input terminal of the ESD circuit and a third interconnection line applied with a logic voltage; and a second diode electrically connected between the input terminal of the ESD circuit and a fourth interconnection line applied with a ground voltage.

6. The device as claimed in claim 5, wherein:

the first diode includes a cathode terminal connected to the third interconnection line and an anode terminal connected to the input terminal of the ESD circuit, and the second diode includes an anode terminal connected to the fourth interconnection line and a cathode terminal connected to the input terminal of the ESD circuit.

7. The device as claimed in claim 6, when negative static electricity is transmitted to the ESD circuit through the second interconnection line, the negative static electricity is discharged to the fourth interconnection line through the second diode.

8. The device as claimed in claim 6, wherein the ESD circuit includes:

a power clamp connected in parallel to the first and second diodes between the third and fourth interconnection lines.

9. The device as claimed in claim 8, when positive static electricity is transmitted to the ESD circuit through the second interconnection line, the positive static electricity is discharged to the fourth interconnection line through the first diode, the third interconnection line, and the power clamp.

10. The device as claimed in claim 1, wherein:

the first data driver chip includes a first terminal to receive the gate driving signal from a timing controller and a second terminal to output the gate driving signal to the first gate driver, and the second interconnection line includes a first interconnection portion to connect the timing controller to the first terminal, a second interconnection portion to connect the first terminal to the second terminal, and a third interconnection portion to connect the second terminal to the first gate driver.

11. The device as claimed in claim 10, wherein the second interconnection portion of the second interconnection line is electrically connected to an input terminal of the ESD circuit.

12. The device as claimed in claim 1, wherein:

the second data driver chip includes a plurality of second data driver chips, and the second interconnection line does not physically pass through the plurality of second data driver chips.

13. The device as claimed in claim 12, wherein the first data driver chip is adjacent to an outermost one of the plurality of second data driver chips.

14. The device as claimed in claim 1, further comprising:

a second gate driver in the display panel and spaced apart from the first gate driver.

15. The device as claimed in claim 14, wherein the first data driver chip includes at least two first data driver chips, the at least two first data driver chips corresponding to the first and second gate drivers, respectively.

16. The device as claimed in claim 15, wherein the at least two first data driver chips are respectively disposed at positions corresponding to the first and second gate drivers.

17. The device as claimed in claim 1, wherein:

the first gate driver is integrated on the display panel, and the first and second data chips are mounted on a flexible circuit board, the flexible circuit board being integrated on the display panel.

18. The device as claimed in claim 1, wherein the gate driving signal includes a vertical trigger signal, a first clock signal, and a second clock signal.

* * * * *